(12) United States Patent
Brown et al.

(10) Patent No.: US 6,826,246 B1
(45) Date of Patent: Nov. 30, 2004

(54) PHASE LOCKED LOOP WITH CONTROL VOLTAGE CENTERING

(75) Inventors: James E. C. Brown, San Jose, CA (US); Jeffrey Lee Sonntag, Allentown, PA (US)

(73) Assignee: Agere Systems, Inc., Allentown, PA (US)

(*) Notice: Subject to any disclaimer, the term of this patent is extended or adjusted under 35 U.S.C. 154(b) by 0 days.

(21) Appl. No.: 09/418,652

(22) Filed: Oct. 15, 1999

(51) Int. Cl.[7] .................................................. H03D 3/24
(52) U.S. Cl. ........................ 375/376; 375/373; 375/327
(58) Field of Search .................... 375/81, 94, 108–120, 375/340, 376, 354, 355, 373, 327, 359; 328/53, 63, 72, 155; 331/1 A, 17; 360/34; 329/50, 122, 313; 327/155, 144

(56) References Cited

U.S. PATENT DOCUMENTS

| | | | |
|---|---|---|---|
| 4,847,569 A | | 7/1989 | Dudziak et al. |
| 4,963,839 A | * | 10/1990 | Stacey ........................... 331/17 |
| 5,254,955 A | * | 10/1993 | Saeki et al. ................... 327/156 |
| 5,382,922 A | | 1/1995 | Gersbach et al. |
| 5,414,741 A | * | 5/1995 | Johnson ....................... 375/376 |
| 5,631,601 A | * | 5/1997 | Horsfall et al. .............. 329/325 |
| 5,739,727 A | * | 4/1998 | Lofter et al. ................... 331/11 |
| 5,783,971 A | * | 7/1998 | Dekker .......................... 331/17 |
| 5,809,097 A | | 9/1998 | Lakshmikumar |
| 6,462,623 B1 | * | 10/2002 | Horan et al. ................... 331/17 |

* cited by examiner

*Primary Examiner*—Stephen Chin
*Assistant Examiner*—Ted Wang
(74) *Attorney, Agent, or Firm*—Duane Morris LLP

(57) ABSTRACT

A phase-locked loop (PLL) with reduced jitter is provided. The PLL includes dual path voltage-controlled oscillator inputs, with a control voltage from a loop filter sent through a low gain path and an integrated error voltage sent through a high gain path. The error voltage is derived from the difference between a reference value representing averaged control voltage and a predetermined portion of the control voltage.

13 Claims, 6 Drawing Sheets

PHASE LOCKED LOOP WITH CONTROL VOLTAGE CENTERING

BACKGROUND OF THE INVENTION

1. Technical Field

The present invention relates generally to phase-locked loops (PLLs); more particularly, to PLLs having control of the center frequency of the Voltage Controlled Oscillator (VCO).

2. Discussion of Related Art

In general, increasing PLL oscillation frequency requires a larger VCO gain. To maintain stable loop dynamics, other parameters of the PLL must be adjusted to accommodate the larger VCO gain. Either the charge pump current can be decreased or the loop filter capacitance can be increased and the loop filter resistance correspondingly decreased. If the charge pump current is decreased, the PLL signal-to-noise ratio (SNR) is degraded, causing an increase in jitter. If the loop filter components are altered, the capacitance must increase, requiring larger surface area of the integrated circuit. Therefore, without some alteration to the PLL dynamics or architecture, higher frequency oscillation requires either larger area or higher jitter.

To increase charge pump current and at the same time decrease loop filter capacitance requires a VCO with a much lower gain. A VCO with low gain cannot achieve a wide range of frequencies without some form of auxiliary control, which can center the oscillation frequency or control voltage to a desired value. Normal PLL operation can then be achieved within a small range about the center value.

FIG. 1 shows a prior art PLL. The phase-frequency detector (PFD) 110 detects the difference in phase between two input signals and activates the charge pump 120, which produces a current proportional to the phase difference. The loop filter 140 integrates this current and forces the VCO 150 to change its frequency of oscillation. Feedback divider 130 forces a steady-state condition in which, after the loop has settled, there is no phase difference and the control voltage to the VCO is constant. The feedback divider (M) 130 is used to change the output frequency relative to the input frequency: Fout=MFin. To keep the loop stability constant, any increase in charge pump current requires a corresponding decrease in VCO gain Ko, or a corresponding increase in $C_1$, $C_2$ and decrease in R.

It is recently known that poor charge pump signal-to-noise ratio SNR can be the dominant source of jitter. To reduce jitter, either Ko needs to be decreased or the loop filter capacitors increased to make room for a larger charge pump current. The problem with decreasing Ko is that the frequency range of the VCO will typically be decreased.

There is a type of VCO based on a delay-interpolating ring oscillator where changing Ko does not affect frequency range. See D. W. Boerstler, "A low-jitter PLL clock generator for microprocessors with lock range of 340–612 MHz" IEEE Journal of Solid-State Circuits, Vol. 34, no. 4, pp. 513–519, April 1999. However, this type of VCO is incompatible with many commonly used phase mixers. In addition, the voltage compliance of the charge pump will need to be large, thereby increasing charge pump noise. Another drawback to delay-interpolating VCOs is the requirement of a number of gain ranges to span the required frequency range.

Another approach to reducing Ko is to calibrate the center frequency of the VCO. FIG. 2 shows a known implementation of a calibrated VCO. Practically, the PLL acts as a frequency synthesizer to realize Fout=(M/N)Fin. The VCO control voltage is a summation of two paths, one path with high gain through frequency detector 260, counter 270, and digital to-analog converter 280 to set the center frequency during calibration. The second path is with low gain through the traditional loop of PFD 220, charge pump 230, and loop filter 240 to serve as the steady state signal path. Higher gain is employed during calibration only, through the calibration loop. Upon frequency lock or steady state, low gain is employed (through the traditional loop). The input to DAC 280 is held constant after calibration. Thus, Ko is reduced.

Other VCO calibration schemes are shown, for example, in U.S. Pat. Nos. 4,847,569 and 5,382,922. The use of VCO calibration presents several problems, such as during calibration or recalibration, the PLL cannot be used as a clock source. A more complicated design of the frequency detector, a larger voltage compliance on the charge pump output, and a lower noise digital-to-analog converter are needed. Also, errors in miscalibration can occur.

Accordingly, to avoid the above problems, a need exists for a PLL which does not require calibration, having a low gain Ko, and having capability to continuously control the VCO center frequency.

SUMMARY OF THE INVENTION

A phase-locked loop (PLL) is provided, having a phase detector, a charge pump, a loop filter, and a voltage-controlled oscillator (VCO), the PLL comprising: an integrator for integrating an error signal derived from a difference between a reference voltage and an averaged voltage representing an average of voltage output from the loop filter; and a signal combiner at the VCO for combining a control voltage output from the loop filter multiplied by gain Ko, and the integrated voltage from the integrator multiplied by a higher multiple of Ko.

The phase detector, charge pump, loop filter and VCO are interconnected in the loop to cause the average value of the control voltage to be the same value as the reference voltage. The voltage output from the loop filter is applied to a resistor-capacitor divider network and the averaged voltage is taken from any portion of said resistor-capacitor divider network. The PLL is preferably implemented in an integrated circuit.

A phase-locked loop method is also provided, comprising the steps of: frequency synthesizing a signal output from a voltage-controlled oscillator (VCO) by a control voltage input to the VCO; feeding-back the signal to a phase-frequency detector; differencing the frequency of the signal from the frequency of a clock signal; producing a variation of the control voltage output for a loop filter based on the differencing; producing an error signal by comparing a difference between a preset reference voltage and a present portion of the control voltage; integrating the error signal to output integrated voltage; and inputting the integrated voltage to the VCO, wherein a combination of the control voltage and the integrated voltage changes the frequency of the signal output by the VCO.

Preferably, a loop having the control voltage has a gain A and a loop having the integrated voltage has a gain B, wherein B is greater than A. Upon reaching steady state, the error signal is substantially zero.

BRIEF DESCRIPTION OF THE DRAWINGS

The foregoing and other features and advantages of this invention will be more readily understood from the following detailed description, when considered in conjunction with the accompanying drawings in which.

DETAILED DESCRIPTION OF PREFERRED EMBODIMENTS

Generally, a PLL according to the present invention is capable of providing and maintaining a control voltage of the VCO. The frequency output by the VCO can be adjusted to maintain the average VCO control voltage to a steady state value.

Figure 3:
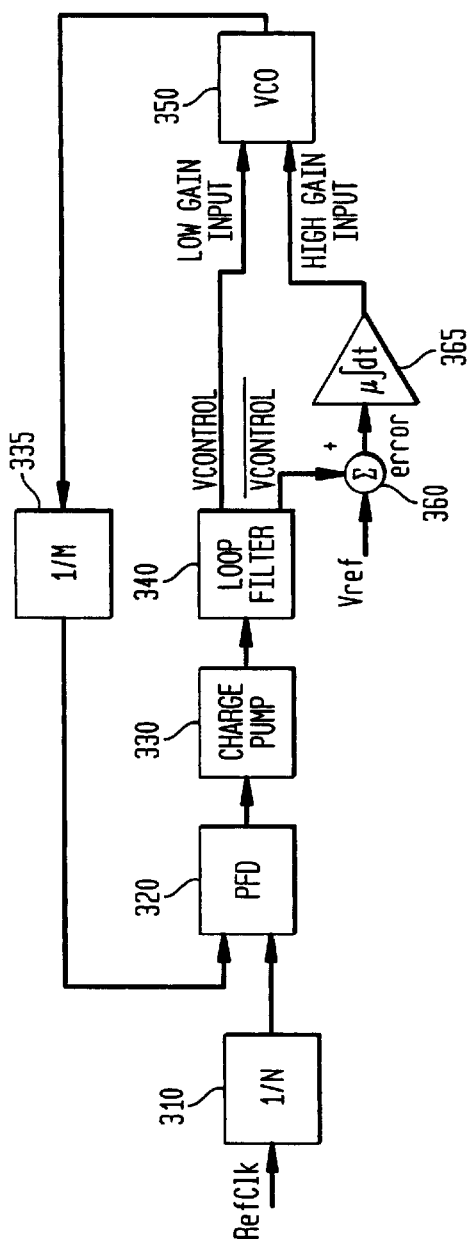
FIG. 3 shows an embodiment of a PLL circuit according to the present invention.
Figure 4:
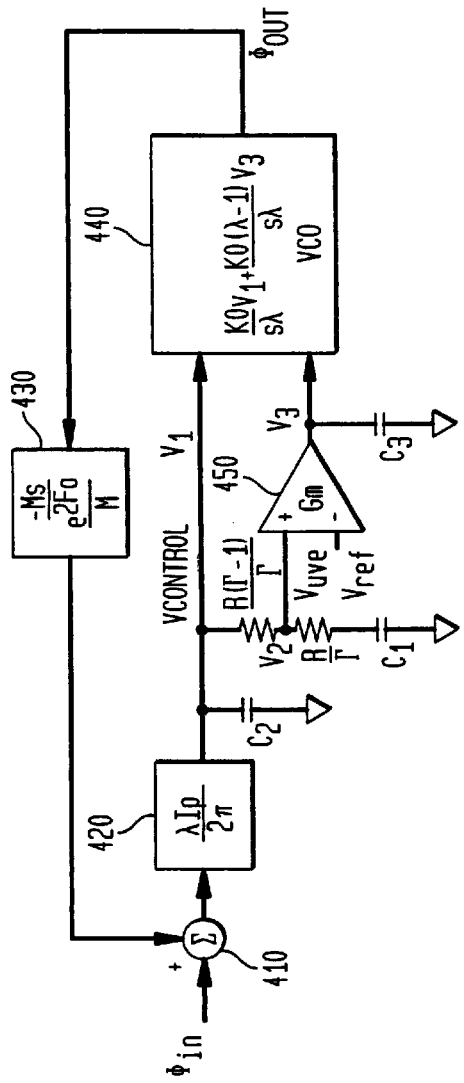
FIG. 4 shows a continuous-time model of the PLL of FIG. 3.

Referring to FIGS. 3 and 4 wherein FIG. 3 is a block diagram of the major components of a PLL according to an illustrative embodiment of the present invention and FIG. 4 shows a continuous-time model of the illustrative PLL of FIG. 3, traditional elements of a PLL circuit, comprising PFD 320, charge pump 330, loop filter 340, VCO 350, and feedback (1/M) 335 are provided. VCO 350 input voltage is supplied from high gain and low gain paths. The low gain path input voltage Vcontrol at VCO 350 is the output voltage of loop filter 340. The high gain path input voltage at VCO 350 is the output voltage from integrator 365, which in turn receives input from subtractor 360. The combination of integrator 365 and subtractor 360 integrates the difference voltages ($\overline{\text{Vcontrol}}$–Vref). $\overline{\text{Vcontrol}}$ or V2 is preferably an averaged value of Vcontrol. The averaging function can be provided by a Resistor/Capacitor network such as shown in FIG. 4 (R–$C_1$). $V_2$ can be taken from any portion of the resistor-capacitor network. In FIG. 4, $V_2$ is taken between the resistors. $V_2$ can also be taken directly from the output of the loop filter, without any averaging. In such case, $V_2$ is equal to Vcontrol. Vref is preferably set at a value expected to be the average value of the range of variations of voltages of the loop filter 340 in steady-state, or Vcontrol, which is also the desired voltage of $V_1$ at VCO 440 (FIG. 4) in steady-state. Vcontrol in FIG. 4 is derived in the same manner as Vcontrol in the prior art PLL of FIG. 1. The main loop filter capacitor $C_1$ is also used to average Vcontrol. An error signal output from subtractor 360 is integrated by integrator 365 and forces the loop to respond to deviations of $\overline{\text{Vcontrol}}$ from the desired voltage of Vref. The low gain path of the VCO allows the use of larger charge pump currents. The larger charge pump current is compensated in the high gain VCO loop by using a small error integrator gain, $\mu$ in integrator 365.

In operation, when there is a large increase in frequency at the input to the PFD 320, charge pump 330 will drive current into loop filter 340, causing Vcontrol to move linearly upwards. Similarly, $\overline{\text{Vcontrol}}$ will also begin moving linearly upwards, although at a slower rate than Vcontrol. Vcontrol will reach the voltage compliance limit of charge pump 330 and charge pump 330 will no longer be able to drive current into loop filter 340. $\overline{\text{Vcontrol}}$ will continue to increase, causing frequency output from VCO 350 to increase until the frequency output from divider 335 becomes larger than the input frequency of PFD 320, or until it too has reached the compliance limit of charge pump 330. When the output frequency of VCO 350 is larger than the input frequency of PFD 320. Vcontrol and $\overline{\text{Vcontrol}}$ will begin to decrease. When $\overline{\text{Vcontrol}}$ is less than Vref, VCO 350 will begin to slow the output frequency. At this point the frequency difference at PFD 320 will be small enough that the PLL can lock to the input frequency. In steady-state the error signal implemented by subtractor 360 and the phase error implemented by PFD 320 are both driven to zero. The voltage input at VCO 350 is the sum of the voltages from the low gain and the high gain inputs, as will be further described below. The components of FIGS. 3 and 4 preferably have the following values: {Ip=6.5$\mu$A, Gm=0.4 $\mu$A/V, R (total)=25 k, $C_1$=200 pF, $C_2$=1.6 pF, $C_3$=50 pF, Ko=1.3 GHz/V, M=250, Fo=500 MHz, $\lambda$=8}. Except Gm and $C_3$, all corresponding components of FIG. 1 have the same values.

Advantageously, implementation of the illustrative PLL according to the present invention achieves: a low jitter because a large charge pump current can be employed while keeping loop gain low; a much less area of the integrated circuit is required; the same stability margin of the traditional PLL without any requirement for calibration of the high gain path; and the VCO high gain input has high noise immunity, because the integrator gain is intentionally made small and the noise transfer function is low-frequency bandpassed.

Figure 1:
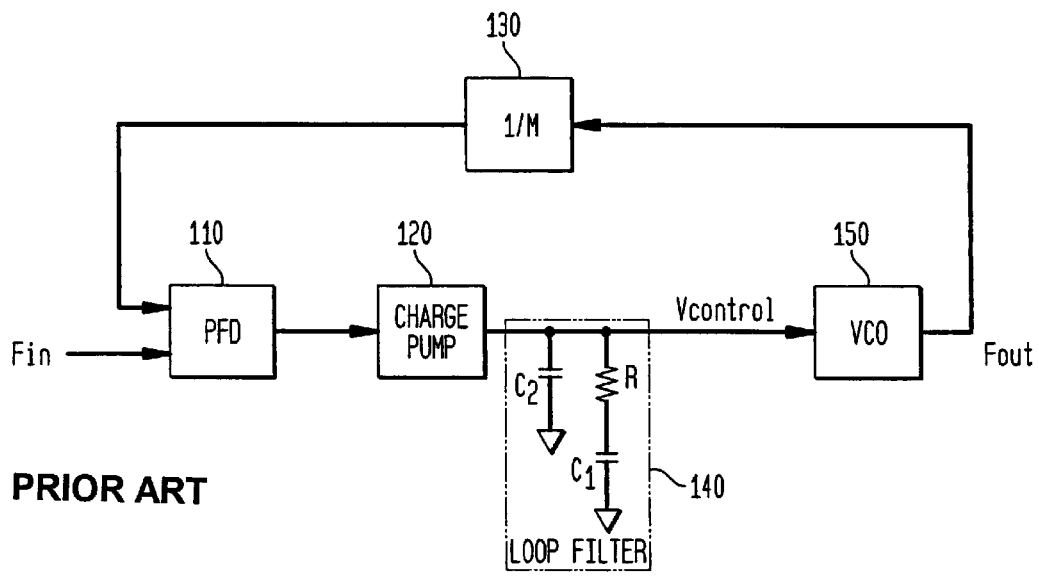
FIG. 1 shows a conventional phase-locked loop (PLL) circuit.
Figure 2:
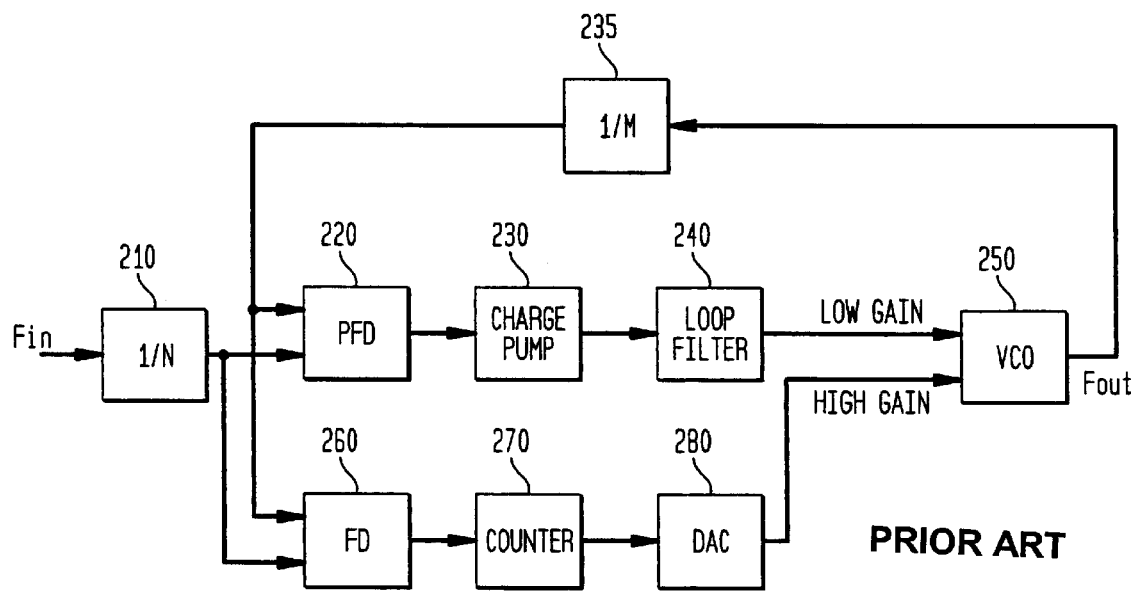
FIG. 2 shows another conventional PLL circuit having VCO calibration.

In the prior art PLL of FIG. 1, the $RC_1$ zero provides phase shift near crossover to make the system stable. With the addition of integrator 365 in the PLL of FIG. 3, another pole and zero are added. The additional zero is formed by a feedforward signal path around the integrator. If the integrator gain is low enough, then the system can be made stable. The loop filter resistors R can be split into two parts and scaled to match the scaling of the two VCO gains, providing additional control over zero location. Alternatively, $V_2$ can be taken from any portion of R, provided by a divided resistor network, as the predetermined portion of $V_1$. For example, in the case where $\Gamma \rightarrow \infty$ where $V_2$ is taken between $C_1$ and $R_1$ the loop gain is $$H(s) = \frac{e^{-\frac{M}{2Fo}s} IpKo((\lambda - 1)Gm + C_3 s + CC_3 Rs^2)}{C_3 M s^3 (C_1 + C_2 + C_1 C_2 Rs)} \quad \text{(EQ 1)}$$

This transfer function has poles at $$\left\{ \{s \rightarrow 0\}, \{s \rightarrow 0\}, \{s \rightarrow 0\}, \left\{s \rightarrow -\frac{C_1 + C_2}{C_1 C_2}\right\} \right\} \quad \text{(EQ 2)}$$

and zeros at $$\left\{ s \rightarrow \frac{1}{2C_1 C_3 R} \left[ -C_3 \pm \sqrt{C_3^2 - 4C_1 C_3 (\lambda - 1)GmR} \right] \right\} \quad \text{(EQ 3)}$$

Compare to the prior art PLL as shown in FIG. 1, the illustrative PLL of FIG. 3 has an additional zero and pole. With two poles and two zeros, a point of stability arises when the two zeros are equal, resulting in $$C_3^2 - 4C_1 C_3 (\lambda - 1)GmR = 0, \quad \text{(EQ 4)}$$

which can be solved for Gm, $$Gm = \frac{C_3}{4C_1(\lambda - 1)R} \qquad (EQ\ 5)$$

The two zeros are now computed as, $$\left\{\left\{s \to \frac{2}{2C_1 R}\right\}, \left\{s \to \frac{1}{2C_1 R}\right\}\right\} \qquad (EQ\ 6)$$

Comparing these zero locations to zero locations of expected optimal stability, start with a second-order loop-gain representing the prior art PLL with two poles at DC and one zero at $z_1$, and equate its crossover frequency to that of the PLL of FIG. 3 with three DC poles and two zeros at $z_2$, yielding $$\frac{(z_2 + s_c)^2}{s_c^3} = \frac{z_1 + s_c}{s_c^2}. \qquad (EQ\ 7)$$

If $|s_c|=10z_1$ is assumed for maximum phase shift from the zero, then (EQ 7) can be approximated as $$z_2 \cong \frac{z_1}{2}. \qquad (EQ\ 8)$$

The zeros can be complex conjugates, but their magnitudes should follow (EQ 8) for stability reasons. If $$C_3 = \frac{C_1}{4}$$

is assumed to keep the capacitive area small, then (EQ 5) becomes $$Gm = \frac{1}{16R(\lambda - 1)}. \qquad (EQ\ 9)$$

When Gm approaches 0, the illustrative PLL according to the present invention degenerates to the prior art PLL and so (EQ 9) can be considered to be an upper bound on Gm. As Gm is decreased, one zero will move towards s=0 and the other will move towards the zero location of the prior art PLL or 1/RC1.

Alternatively, $V_2$ can be taken from the output of the loop filter. In such case, $\Gamma$=0 and $\overline{Vcontrol}$=Vcontrol.

Figure 5:
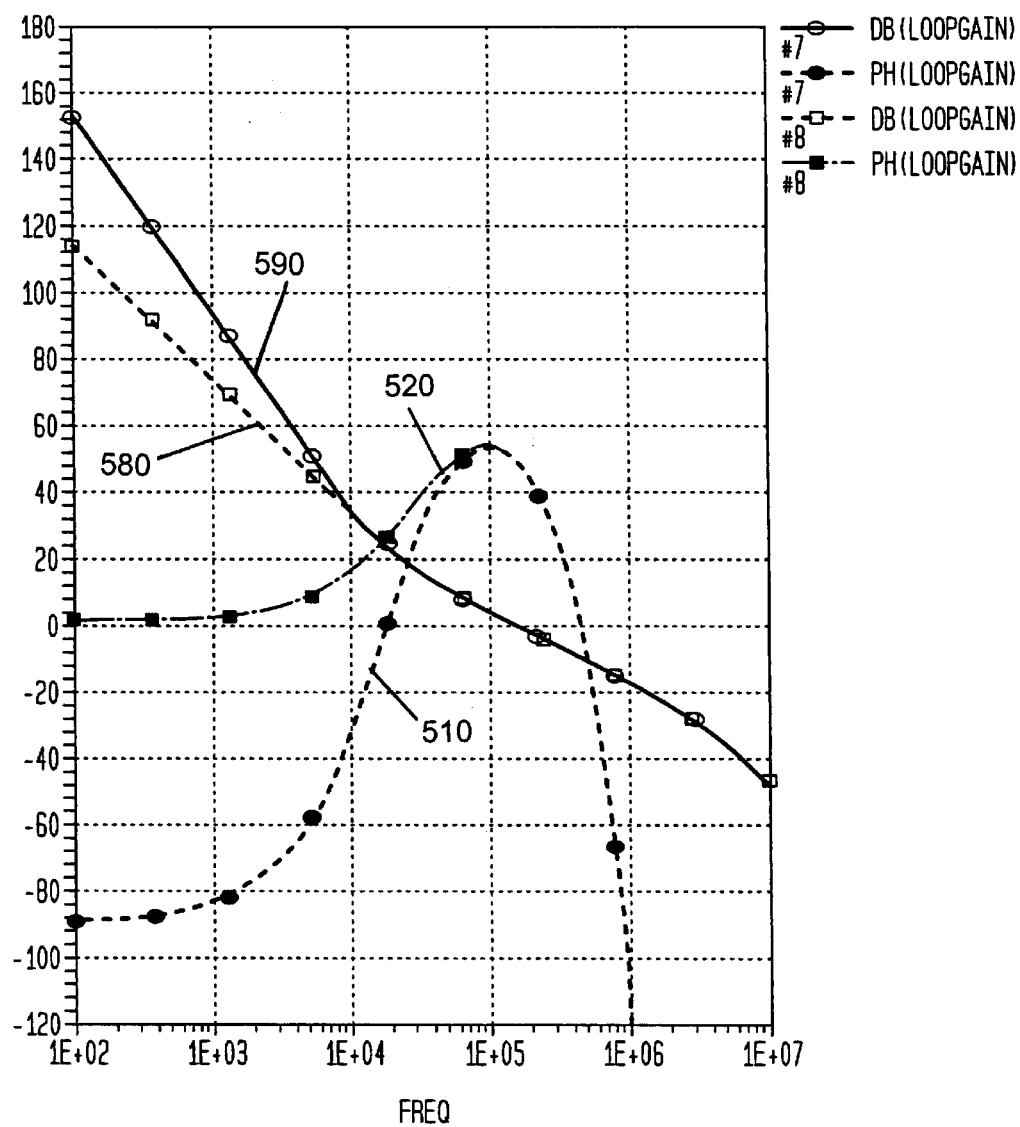
FIG. 5 is a graph comprising the loop gain of the PLL of FIG. 3 and the conventional PLL.

FIG. 5. shows the loop gain for the illustrative PLL of FIG. 3 compared to that of the prior art PLL of FIG. 1. The phase margin is 50 degrees for both PLLs. Curves 510 and 520 represent the decibel (DB) and phase (PH) loop gain of the PLL of FIG. 3. 580 and 590 are plots of DB and PH loop gain of the PLL of FIG. 1. As can be seen in FIG. 5, the response of the PLL of FIG. 3 is very similar to that of the prior art PLL, except that the initial rolloff is third order instead of second order and two zeros contribute to create a stable crossover instead of one.

Figure 6A:
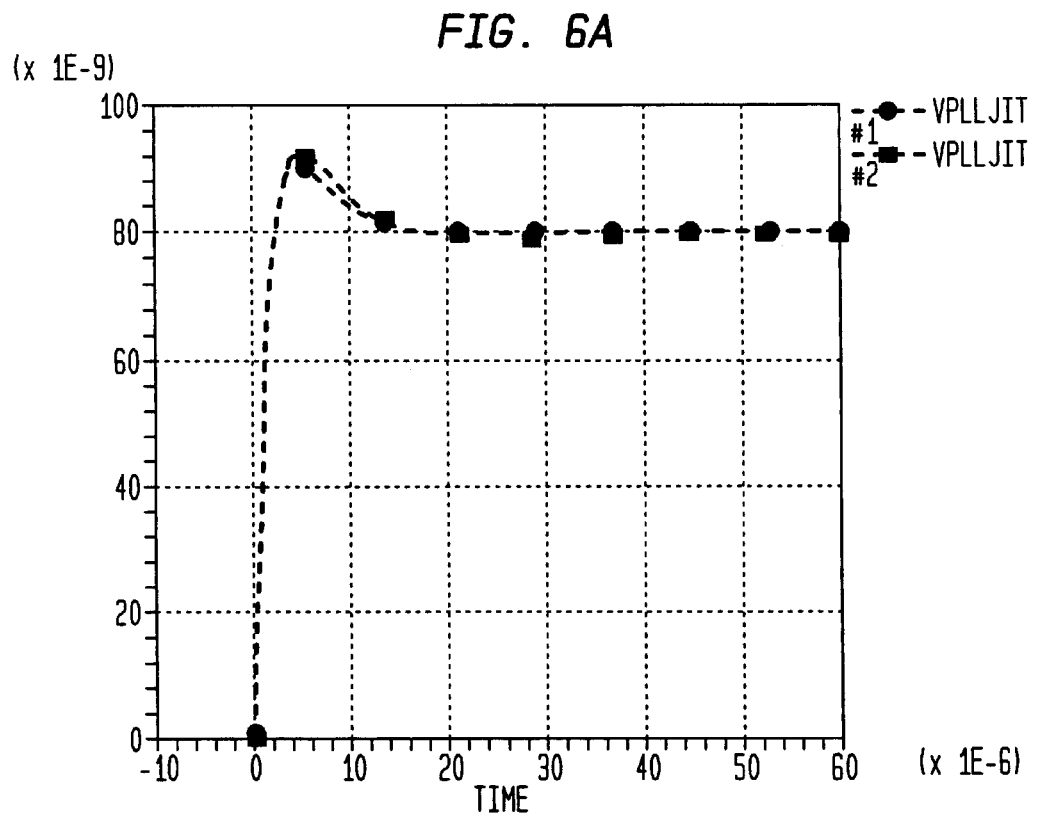
FIGS. 6A and 6B are step response plots of the PLL of FIG. 3 and the conventional PLL of FIG. 1.
Figure 6B:
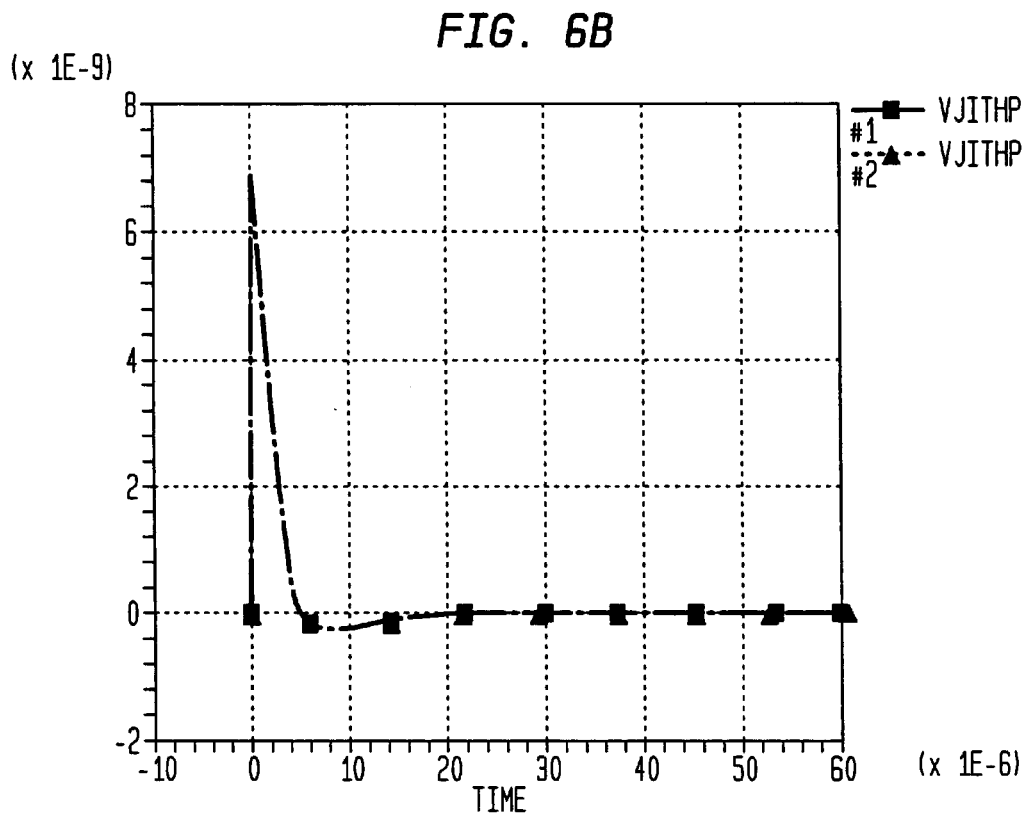

FIGS. 6A and 6B show the step responses of the PLLs of FIGS. 1 and 3 reacting to a 1 Radian step input. The output phase has been converted to seconds, so that a 1 Radian input step is equivalent to a 79.618 ns output step at 500 MHz. FIG. 6A shows plots of phase settling for both PLLs and FIG. 6B shows DPLL response of both PLLs. The plots of the PLLs virtually overlap. Thus, the general dynamics of the loops are very similar; however there is a longer settling characteristic which is not similar. The PLL of FIG. 3 has a long tail. This is primarily because the loop with the extra integrator is slow for stability and noise reasons.

Figure 7A:
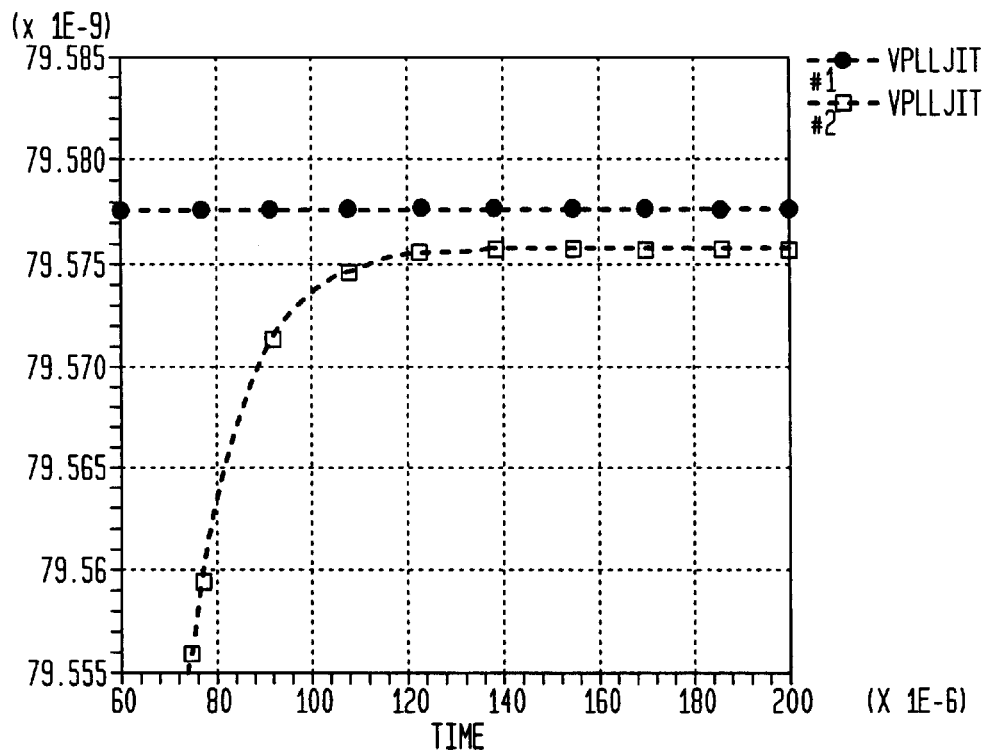
FIGS. 7A and 7B are magnified step response plots of the PLL of FIG. 3 and the conventional PLL.
Figure 7B:
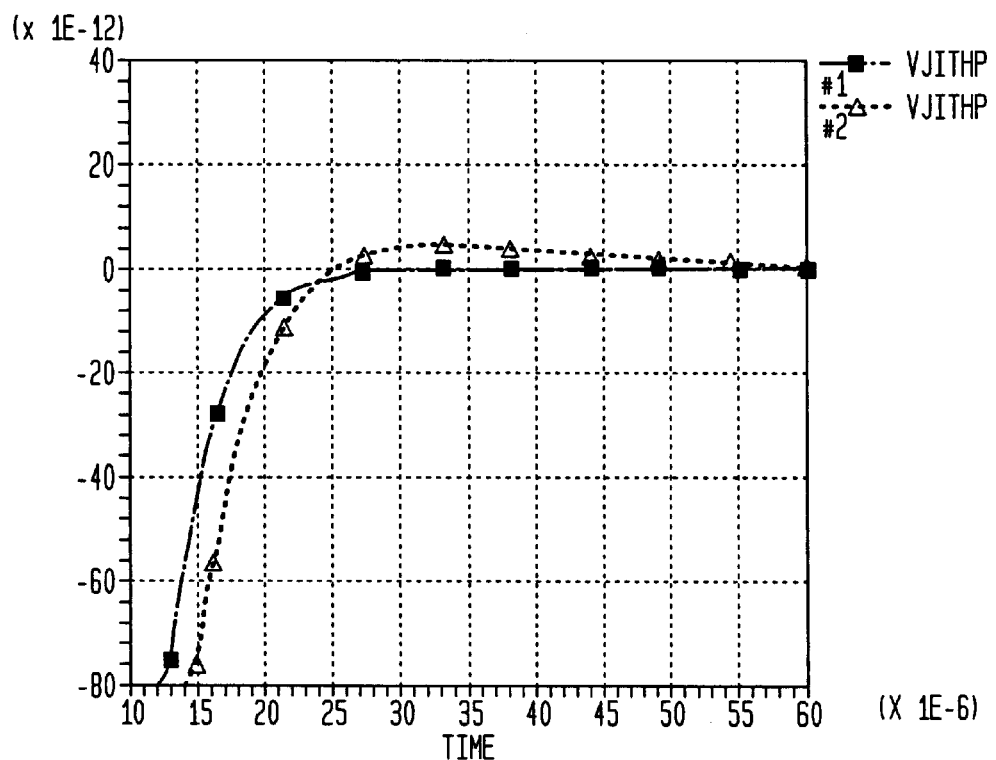

FIGS. 7A and 7B show magnified regions of step response plots corresponding to FIGS. 6A and 6B, respectively. The slow loop has drawn the settling time out to ~60 $\mu$secs. In applications where the PLL is part of a digital PLL (DPLL), the DPLL will filter out most of this long tail. FIG. 7A shows phase settling in seconds and FIG. 7B shows DPLL response in seconds.

To keep down noise contributed by integrator 365 at the high gain input of the VCO, the noise contribution of Gm is made arbitrarily small. As the Gm is reduced, the noise bandwidth and the noise power spectral density are both reduced linearly. The most obvious practical limit is the settling time of the slow high-gain loop. Practically, the transconductance of charge pump 330 will be much larger than the integrator 365 and so the integrator gain is determined more by stability considerations.

As an example, consider two input current noise sources, one at node $V_1$ (FIG. 4) representing the charge pump current noise and the other at node $V_3$ representing the Gm 450 current noise. The transfer function from the charge pump current noise to the output is given by $TF_{cp}(f)$ and the transfer function from the Gm current noise to the output is given by $TF_{Gm}(f)$. If both noise sources are white and the charge pump noise is proportional to Ip (i.e. $V_{GS}$-$V_T$ on is constant for any given Ip), then the ratio of the total noise power from each source is $$\Psi = \frac{Gm \int_0^\infty |TF_{Gm}(F)|^2\, df}{\lambda gm_{lp} \int_0^\infty |TF_{CP}(f)|^2\, df} \qquad (EQ\ 10)$$

For preferred component values of FIG. 3 given above, $\psi$=0.24, which corresponds to an 11% increase in RMS jitter from Gm. The optimal choice for Gm is likely where its area is equivalent to that of $C_3$, since increasing Gm and decreasing $C_3$ causes instability.

Figure 8:
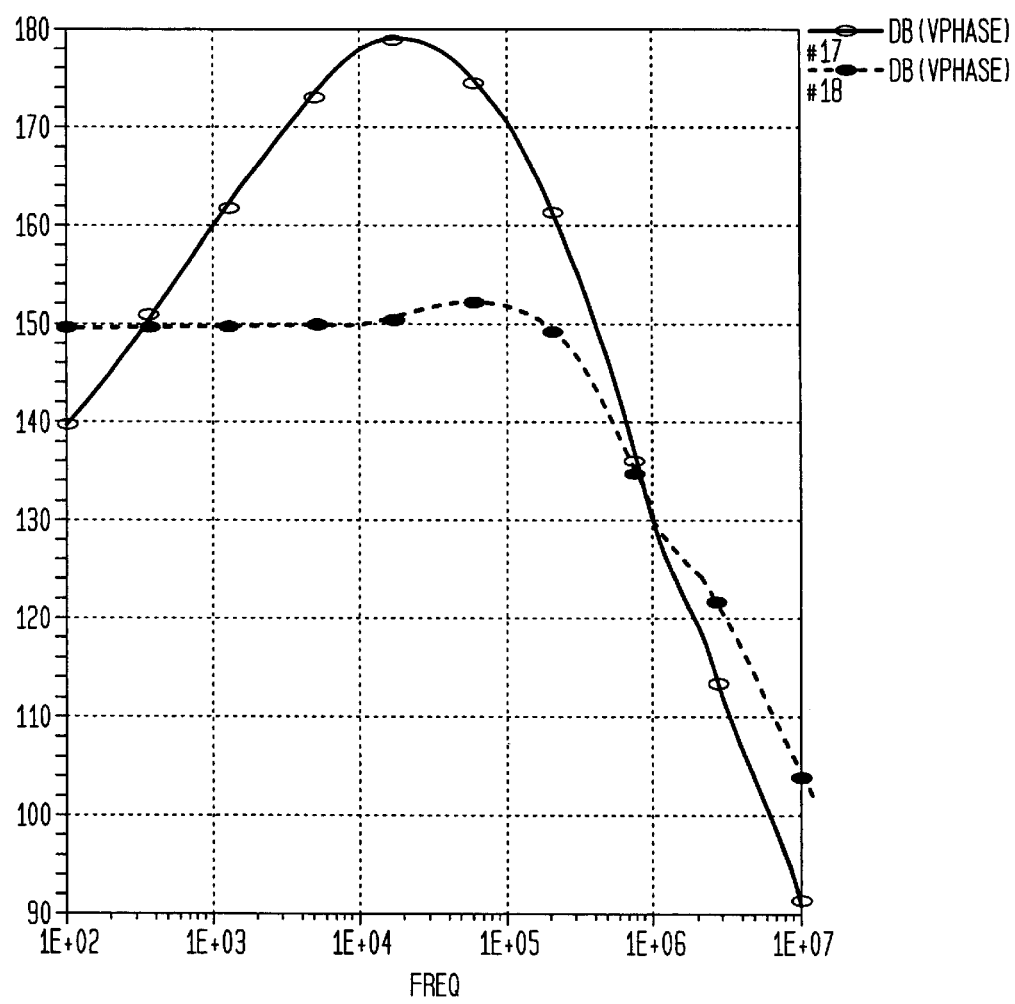
FIG. 8 is a plot of the noise transfer function for Gm current noise and charge pump current noise.

FIG. 8 shows a comparison between the two noise transfer functions, plot 17 for Gm current noise and plot 18 for charge pump current noise. It can be seen that despite more gain in the Gm current noise transfer function, its limited bandwidth and the small noise variance limit output noise contribution. The RMS jitter goes from 113 ps in the prior art PLL to 42 ps in the PLL of FIG. 3 (M=250 for both cases).

As shown above, the illustrative PLL of FIG. 3 achieves the same jitter performance as a PLL operating with a much larger loop filter capacitor and charge pump. An 800% increase in charge pump current, which would normally require an 800% increase in capacitor area, is realized with only about a 25% increase in capacitor area.

While the present invention has been described above with reference to specific embodiments thereof, it is understood that one skilled in the art may make many modifications to the disclosed embodiments without departing from the spirit and scope of the invention as defined by the appended claims.

What is claimed is:

1. A phase-locked loop (PLL) having a phase detector, a charge pump, a loop filter, and a voltage-controlled oscillator (VCO), the PLL comprising:

an integrator for integrating an error signal derived from a difference between a reference voltage and an averaged voltage representing an average of voltage output from the loop filter; and a signal combiner at the VCO for combining a control voltage output from the loop filter multiplied by gain Ko, and the integrated voltage from the integrator multiplied by a higher multiple of Ko.

2. The PLL according to claim 1, wherein the reference voltage is an average of the output of the loop filter at steady-state.

3. The PLL according to claim 1, wherein the phase detector, charge pump, loop filter and VCO are interconnected in the loop to cause the value of the predetermined portion of the control voltage to be the same value at steady-state as the reference voltage.

4. The PLL according to claim 1, wherein a frequency of the VCO output signal varies corresponding to variations in the control voltage and the integrated voltage.

5. The PLL according to claim 1, wherein the voltage output from the loop filter is applied to a resistor-capacitor divider network and the averaged voltage is taken from any portion of said resistor-capacitor divider network.

6. A phase-locked loop method, comprising the steps of:
frequency synthesizing a signal output from a voltage-controlled oscillator (VCO) by a control voltage input to said VCO;
feeding-back said signal to a phase-frequency detector;
differencing the frequency of the signal from the frequency of a clock signal;
producing a variation in the control voltage output from the loop filter based on said differencing;
producing an error signal by comparing a difference between a preset reference voltage and a preset portion of said control voltage;
integrating said error signal to output an integrated voltage; and
inputting said integrated voltage to said VCO, wherein a combination of said control voltage and said integrated voltage changes the frequency of said signal output by said VCO.

7. The method according to claim 6, wherein a loop having said control voltage has a gain A and a loop having said integrated voltage has a gain B, wherein B is greater than A.

8. The method of claim 6, wherein said preset reference voltage is an average of output voltages of said control voltage at steady-state.

9. The method of claim 6, wherein upon reaching steady state, said error signal is substantially zero.

10. The method of claim 6, wherein said preset portion is any percentage of said control voltage.

11. In an integrated circuit, a phase-locked loop (PLL) comprising:
a voltage-controlled oscillator (VCO), interconnected to a phase detector, a charge pump, and a loop filter for outputting a frequency synthesized signal based on a control voltage output from said loop filter;
an integrator for integrating an error voltage, said error voltage derived from a difference between a reference voltage and a predetermined portion of said control voltage; and
a signal combiner for combining said control voltage and said integrated voltage to produce a combined signal and applying said combined signal to said VCO for changing said synthesized signal based on said combined signal.

12. The integrated circuit of claim 11, wherein a gain A is applied to a loop having said control voltage and a gain B is applied to a loop having said integrated voltage, wherein gain B is larger than gain A.

13. The integrated circuit of claim 11, wherein said reference voltage is set to be substantially equal to an average of voltage variations of the control voltage.

* * * * *